United States Patent
Bader et al.

(10) Patent No.: US 7,446,341 B2
(45) Date of Patent: Nov. 4, 2008

(54) RADIATION-EMITTING SEMICONDUCTOR ELEMENT

(75) Inventors: Stefan Bader, Eilsbrunn (DE); Michael Fehrer, Bad Abbach (DE); Wilhelm Stein, Donaustauf (DE); Stephan Kaiser, Regensburg (DE); Volker Harle, Laaber (DE); Berthold Hahn, Hemau (DE)

(73) Assignee: Osram GmbH, Munich (DE)

( * ) Notice: Subject to any disclaimer, the term of this patent is extended or adjusted under 35 U.S.C. 154(b) by 669 days.

(21) Appl. No.: 10/669,227

(22) Filed: Sep. 24, 2003

(65) Prior Publication Data

US 2004/0119085 A1 Jun. 24, 2004

(30) Foreign Application Priority Data

Sep. 26, 2002 (DE) ................. 102 44 986

(51) Int. Cl.
*H01L 27/15* (2006.01)
(52) U.S. Cl. ....................................... 257/79
(58) Field of Classification Search ................ 257/79
See application file for complete search history.

(56) References Cited

U.S. PATENT DOCUMENTS

| | | | |
|---|---|---|---|
| 6,465,808 B2* | 10/2002 | Lin | 257/81 |
| 6,573,527 B1* | 6/2003 | Sugiyama et al. | 257/14 |
| 6,673,254 B1* | 1/2004 | Marshall et al. | 216/2 |
| 6,693,352 B1* | 2/2004 | Huang et al. | 257/743 |
| 2001/0042866 A1* | 11/2001 | Coman et al. | 257/103 |
| 2002/0063256 A1 | 5/2002 | Lin | |
| 2003/0141604 A1 | 7/2003 | Eisert et al. | |

FOREIGN PATENT DOCUMENTS

| | | |
|---|---|---|
| DE | 196 48 309 A1 | 7/1997 |
| DE | 199 21 987 A1 | 11/1999 |
| DE | 100 16 503 A1 | 12/2000 |
| DE | 100 26 254 A1 | 11/2001 |
| JP | 10-173235 A | 6/1998 |

* cited by examiner

*Primary Examiner*—Kiesha L Rose
(74) *Attorney, Agent, or Firm*—Cohen Pontani Lieberman & Pavane LLP

(57) ABSTRACT

A radiation-emitting semiconductor component having a semiconductor body (1), which has an active zone (2), in which, for the purpose of electrical contact connection, a patterned contact layer (3) is applied on a surface of the semiconductor body. Interspaces (4) are distributed over the contact layer (3) and are provided for the purpose of forming free areas (5) on the surface which are not covered by the contact layer (3). The free areas (5) are covered with a mirror (6). The separation of the two functions of contact connection and reflection makes it possible to achieve a particularly high performance of the component.

25 Claims, 2 Drawing Sheets

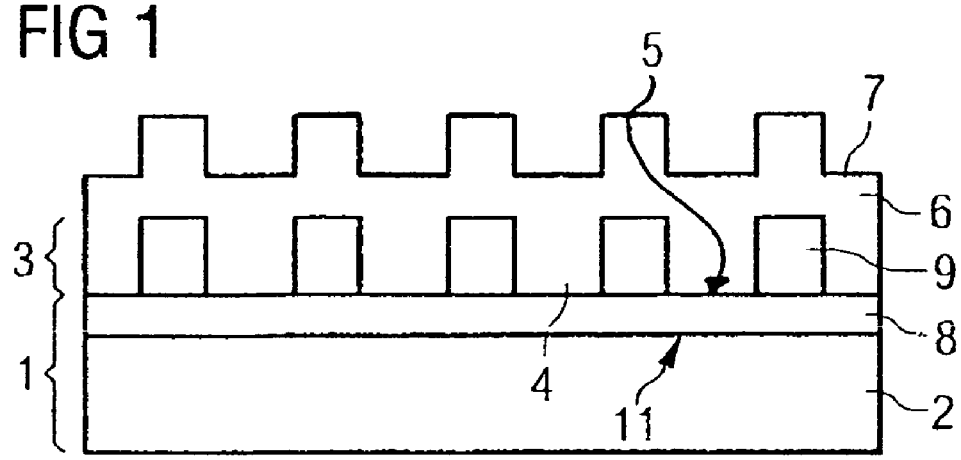
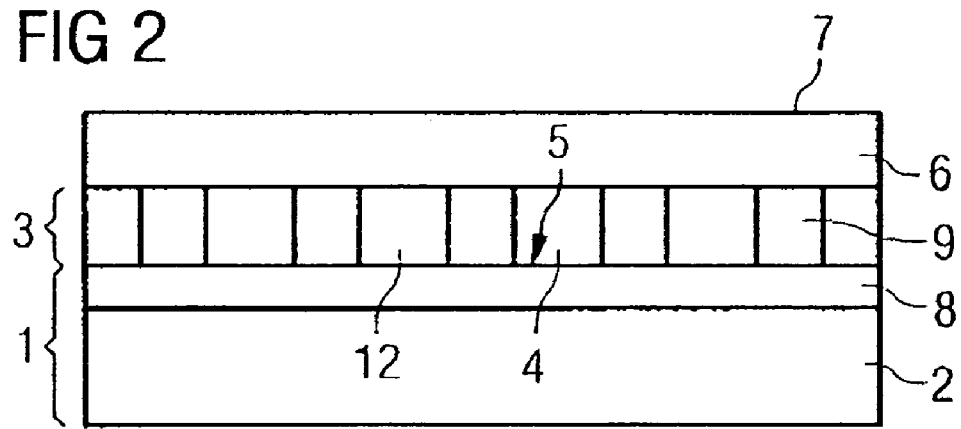
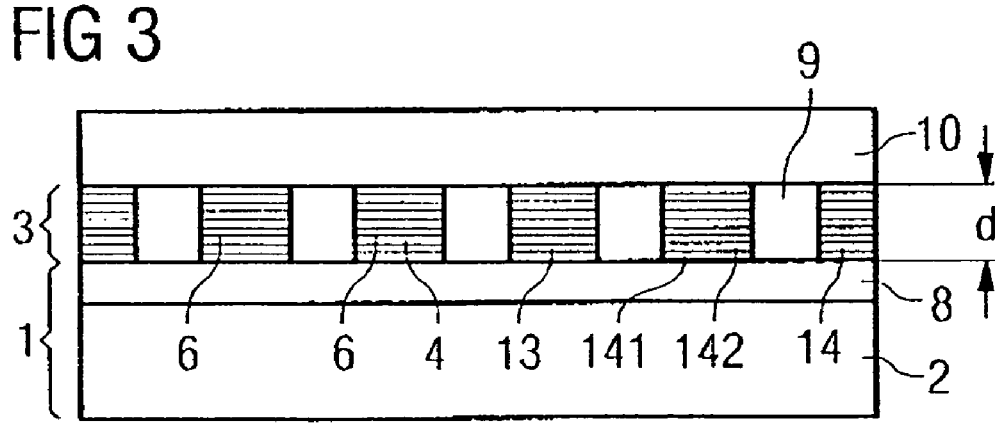

RADIATION-EMITTING SEMICONDUCTOR ELEMENT

BACKGROUND OF THE INVENTION

1. Field of the Invention

The invention relates to a radiation-emitting semiconductor component having a semiconductor body, which has an active zone. The semiconductor body is electrically contact-connected and provided with a mirror.

2. Background of the Invention

In the production of light-emitting diode chips based on GaN, there is the fundamental problem that the maximum achievable electrical conductivity of p-doped layers, in particular of p-doped GaN or AlGaN layers, does not suffice for achieving a current expansion over the entire lateral cross section of the chip using a conventional front-side contact metallization known from light-emitting diode chips of other material systems (such a metallizatiion covers only a fraction of the front side for the purpose of coupling out the highest possible amount of radiation).

Growing the p-conducting layer onto an electrically conductive substrate, which would enable current to be impressed over the entire lateral cross section of the p-conducting layer, does not lead to an economically tenable result. The reasons for this can be explained as follows. Firstly, the production of electrically conductive lattice-matched substrates (e.g. GaN substrates) for the growth of GaN-based layers is associated with a high technical outlay; secondly, growing p-doped GaN-based layers onto non-lattice-matched substrates that are suitable for undoped and n-doped GaN compounds does not lead to a crystal quality that is adequate for a light-emitting diode.

In a known approach for combating the problem mentioned above, that side of the p-conducting layer which is remote from the substrate has applied to it, over the whole area, a contact layer which is transmissive to the radiation or an additional electrically readily conductive layer for current expansion, which is provided with a bonding contact.

However, the first-mentioned proposal is associated with the disadvantage that a considerable part of the radiation is absorbed in the contact layer. The second-mentioned proposal requires an additional process step, which significantly increases the manufacturing outlay.

The document DE 100 26 254 A1 discloses a component of the type mentioned in the introduction in which a whole-area contact connection in the form of a silver layer is applied on a semiconductor chip. In this case, in addition to the electrical contact with respect to the light-emitting diode chip, the said silver layer also functions as a reflector for the radiation radiated from the active zone of the chip.

Although the silver layer in the known component forms an ohmic contact which is distinguished by a relatively low resistance compared with a Schottky contact that possibly occurs as well, the contact resistance is nevertheless still too high for many applications.

SUMMARY OF THE INVENTION

It is an object of the present invention to specify a radiation-emitting semiconductor component in which provision is made of a contact connection having both a low contact resistance and a good reflectivity for the radiation generated in the component.

This and other objects are attained in accordance with one aspect of the present invention directed to a radiation-emitting semiconductor component having a semiconductor body. The semiconductor body contains an-active zone. When energized, the active zone generates an electromagnetic radiation. A patterned contact layer is provided for the purpose of electrical contact connection of the semiconductor body. The contact layer is applied on a surface of the semiconductor body. Interspaces distributed over the contact layer are provided, which serve for forming free areas on the surface of the semiconductor body. The free areas are not covered by the contact layer. At least some of the free areas are covered with a mirror.

Spatially separating the two functions of electrical contact and mirror from one another makes it possible to optimize each of the two functions with regard to the material selection of the corresponding electrical or optical component. As a result, it is possible to produce a semiconductor component in which the electrical contact connection is optimized both with regard to its electrical properties, in particular with regard to its contact resistance, and with regard to the optical properties, in particular with regard to the reflectivity for the light generated in the component.

In this case, the surface of the semiconductor body is subdivided into regions which are covered by the patterned contact layer and which correspondingly serve for the electrical contact connection of the semiconductor body. Furthermore, there are regions separated therefrom which are covered with a mirror and which therefore serve for the reflection of the light generated in the semiconductor component.

In one embodiment of the semiconductor component, the mirror is embodied such that it covers the surface of the semiconductor body as a closed mirror layer. This embodiment of the semiconductor component has the advantage, on the one hand, that no patterning measures are required for producing the mirror, as a result of which the mirror can be produced in a highly cost-effective manner. On the other hand, the embodiment of the mirror as a closed mirror area means that the radiation transmitted towards the outside through the patterned contact layer can likewise be reflected and is thus not lost for the optical output power of the radiation-emitting semiconductor component.

In this case, the closed mirror layer covers both the regions of the patterned contact layer and the free areas of the surface of the semiconductor body. In another embodiment of the component, the materials for the contact layer and the mirror, respectively, are chosen such that the material of the contact layer links electrically better to the semiconductor body than the material of the mirror layer. What is thereby achieved is that the region of the electrical contact area is unambiguously assigned to the function of electrical contact connection. What is thus furthermore achieved is that a double optimization as is required in particular in the case of known components does not have to be taken into account. This means that it is possible to choose a different material for the contact layer than for the mirror layer. In particular, a material which is optimized with regard to the electrical linking to the semiconductor body may be chosen as the contact layer.

Conversely, it is advantageous, moreover, to choose the materials for the contact layer and the mirror layer such that the material of the mirror layer reflects the radiation generated in the component better than the material of the contact layer. This means that it is possible to select for the mirror layer a material which, for its function as a mirror, that is to say with regard to its reflective properties, can be adapted to its optical function and, in particular, to the radiation generated by the component or the wavelength of the said radiation.

Moreover, in many radiation-emitting semiconductor components, both an n-doped and a p-doped layer are provided for the electrical contact connection. By way of example, light-emitting diodes or else laser diodes are realized with the aid of the layers doped in this way. A contact connection by means of an n-doped and p-doped layer arranged at the opposite side areas of the semiconductor body is taken into consideration in particular in the case of components in which the semiconductor body is formed on the basis of a nitride compound semiconductor. By way of example, consideration is given to using gallium nitride as the nitride compound semiconductor. The term "components based on gallium nitride" hereinafter includes in particular all ternary and quaternary mixed crystals based on gallium nitride, such as, for example, aluminium nitride, indium nitride, aluminium gallium nitride, indium gallium nitride, indium aluminium nitride and aluminium indium gallium nitride and on gallium nitride itself.

Owing to the poor electrical conductivity of the p-doped layers in material systems based on gallium nitride, the invention can be used particularly advantageously for the contact connection of such a p-doped layer.

Accordingly, an embodiment of the component in which the surface of the semiconductor body is formed by a p-doped layer made of a nitride compound semiconductor, and in which the material of the contact layer forms an ohmic contact with respect to the surface of the semiconductor body, is advantageous. This is because the poor conductivity of the p-doped layer means that generally there is the risk of a Schottky contact being formed in the event of the p-doped layer being contact-connected with a material that is not as well suited, the said Schottky contact having a high contact resistance.

A material which forms an ohmic contact with a p-doped semiconductor layer based on gallium nitride is platinum or nickel, for example. Accordingly, it is particularly advantageous if the contact layer contains platinum or nickel or even completely comprises one of the two metals.

Materials which reflect the radiation emitted by the component are suitable as the mirror layer. For the wavelength range of between 380 and 550 nm to which particular attention is paid here, aluminium or silver are materials that are considered, in particular, for the mirror layer.

It is advantageous, moreover, if the contact layer has a layer thickness that is as large as possible, since this enables the highest possible part of the radiation generated by the component also to be reflected in the contact layer, which advantageously reduces the optical losses of the component. However, for cost reasons, in particular when using platinum as the material for the contact layer, it is not possible to form a contact layer of arbitrary thickness. Therefore, in the case of platinum, the contact layer is limited to a thickness of at most 100 nm. A layer thickness of between 15 and 30 nm is preferably used for the contact layer.

In one embodiment of the component, the contact layer comprises contact elements that are separated from one another. The contact elements are electrically conductively connected to one another by a connecting layer provided above the contact layer.

This embodiment of the component has the advantage that the contact layer covers only that part of the surface of the semiconductor body which is necessarily required for the electrical contact connection. Consequently, a large area for the mirror or the mirror layer remains between the contact elements that are separated from one another, as a result of which it is possible to optimize the optical properties of the component.

In a particularly advantageous embodiment of the component, the connecting layer for making contact among the contact elements is identical to the mirror layer, which, as has already been explained, may advantageously comprise aluminium or silver.

In a particularly advantageous embodiment of the invention, the contact elements have the form of cylinders situated on the surface of the semiconductor body. This results in a circular contact area between the contact element and the surface of the semiconductor body. This highly symmetrical contact area has the advantage of enabling the implementation of a series of possibilities for further optimization of the contact connection since, on account of the high symmetry, the contact connection is accessible in a particularly simple manner to mathematical simulation or modeling.

Furthermore, cylindrical contact elements also have the advantage that, if the cylinders all have the same height, they can be produced in a particularly simple way from a metal layer sputtered on the surface of the semiconductor body, or applied in a similar suitable method, by patterning this metal layer in a photolithographic process.

In an advantageous embodiment of the component, the contact elements may be arranged at the nodes of a regular grid. The advantage afforded in this case is that the shaping and the dimensions of the grid chosen enable optimization of the position of the contact elements on the one hand with regard to the electrical contact connection, in particular a low contact resistance or optimum energization of the active zone, and on the other hand with regard to the optical properties. Optimum optical properties are obtained if the light absorption in the contact layer is as low as possible, which means that the coverage of the surface of the semiconductor body with the contact layer should be as low as possible.

The arrangement of the contact elements at the nodes of a regular grid furthermore has the advantage that such an arrangement is accessible to mathematical optimization by means of simulation or modelling.

In one embodiment of the component, the contact elements are arranged at the nodes of a square grid. In this case, it is advantageous if the distances between the contact elements are chosen taking account of the transverse conductivity of the p-doped layer. The transverse conductivity leads to an expansion of the current path, which is still limited to the diameter of the contact element at the contact point between contact element and p-doped layer, in the direction of the active zone.

What is an optimum choice for the distance between the contact elements, then, is if the current cones—arising from the expansion—of the individual contact elements on the surface of the active zone touch one another, thereby ensuring that the entire surface of the active zone is energized. For the case where the current cones issuing from the individual contact elements do not touch one another, it follows that the active zone is not energized over the whole area. For the opposite case where the current cones of adjacent contact elements overlap, it follows that an excessively high coverage of the surface of the semiconductor body with contact elements is present since the regions of the overlapping current cones do not lead to improved energization of the active zone, but the coverage of the semiconductor body with contact elements increases as the distance between the contact elements decreases, whereby the optical properties deteriorate in a disadvantageous manner.

The distances between the nodes in the square grid may be chosen such that the current cones of adjacent contact elements touch one another or overlap on the surface of the active zone, so that ultimately only very little or no area of the active zone remains unenergized.

The arrangement of the contact elements at the nodes of a square grid may also be optimized with regard to the coverage. For the case where whole-area energization of the active zone is required, the nodes of the square grid have to be at a relatively short distance from one another in order namely to ensure that the region in the centre of each square can be reliably energized. However, this leads to a relatively large overlap of the current cones between two directly adjacent contact elements. In this respect, it is advantageous if the contact elements are arranged at the nodes of a differently configured regular grid. By way of example, consideration is given to arranging the contact elements at the nodes of a hexagonal grid. In addition to the nodes of the hexagonal grid, a further contact element is also arranged in the centre of each hexagon. In this case, whilst complying with the requirement for whole-area energization of the active zone, it is possible to reduce the density of the contact elements on the surface of the semiconductor body since the additional central arrangement of further contact elements and the choice of a hexagonal grid promote the geometrical conditions.

The arrangement of contact elements at the nodes of a regular hexagonal grid, an additional contact element being arranged in the centre of each hexagon, is the subject-matter of a further independent invention which, although it is used particularly advantageously in conjunction with the component described further above, is also advantageously used in a multiplicity of further electrical contact connections. This independent invention provides for the surface of a body to be contact-connected by means of contact elements which are arranged in a manner insulated from one another at the nodes of a regular hexagonal grid. In addition, contact elements are arranged in the centre of each hexagon.

The arrangement of the contact elements can also be obtained by arranging spheres in a plane two-dimensionally in the densest packing. This means that a first sphere is arranged in the plane. Six further spheres are placed around the first sphere. In the interspaces between the six further spheres, six further spheres are placed around the central first sphere and so on and so forth. Projection of the sphere centre points onto the plane yields those points at which the contact elements have to be arranged in the case of the hexagonal arrangement mentioned here.

In a further embodiment of the component, interspaces are filled with a filler in order to at least partially planarize the surface of the patterned contact layer. This is possible in particular in the case where the contact layer is a layer with a homogeneous layer thickness. Electrically conductive materials, for example, are taken into consideration as the filler. By filling the interspaces of the patterned contact layer with an electrically conductive material, it is possible to improve the electrical contact connection of the semiconductor body. However, this results in the disadvantage that the materials that are taken into consideration as filling material and are occasionally furnished with very poor optical properties, for example zinc oxide or indium tin oxide, lead to intensified absorption of the light generated in the active zone of the semiconductor body.

In another embodiment of the component, consideration is given to using transparent and electrically insulating materials as the filler for the interspaces. The advantage afforded in this case is that, as a result of the transparency of the materials used, absorption of the light generated in the active layer takes place only to a very small extent. On the other hand, the transparent and electrically insulating materials have the disadvantage that they cannot significantly improve the electrical contact connection of the semiconductor body.

By way of example, silicon oxide, compounds of silicon and nitrogen and also titanium dioxide or else plastics such as polyimide are taken into consideration as the transparent and electrically insulating materials.

In a further embodiment of the component, the fillers may form Bragg reflectors. In this case, a Bragg reflector is arranged in each interspace of the contact layer. Such Bragg reflectors have the advantage that they lead to additional reflection of the light generated in the semiconductor body and thus help to improve the optical properties of the component. Bragg reflectors furthermore have the advantage that they can be adapted to a very specific wavelength, whereby the selectivity of the reflection can be improved. This is advantageous particularly when a narrow spectral range is intended to be filtered out from a relatively wide optical spectrum radiated by the semiconductor body.

The Bragg reflectors may be applied by various procedures in this case.

By way of example, it is possible to apply the Bragg reflectors even before the application of the contact layer to the semiconductor body. In this case, consideration is given to producing Bragg reflectors by a continuation of the epitaxial growth, which, by way of example, may directly follow the growth of the p-doped layer, which Bragg reflectors are grown epitaxially and can advantageously be produced from undoped semiconductor material, preferably based on nitride compound semiconductors. Afterwards, the Bragg reflector applied over the area is patterned in order subsequently to enable the patterned contact layer to be applied at those areas of the semiconductor body which are free of Bragg reflector.

Another procedure provides for the Bragg reflector to be deposited by a layer deposition method, for example chemical vapour deposition or else sputtering from dielectrics, after the application of the patterned contact layer. After the deposition of the Bragg reflector, it may be necessary, if appropriate, for those parts of the Bragg reflector which grow over the contact layer subsequently to be removed again in order to apply a mirror layer or a connecting layer on the top side of the contact layer.

The planarization of the electrical contact layer has the advantage of facilitating subsequent method steps for producing the component, such as, by way of example, the rear-side mating bonding of a carrier wafer, which may comprise germanium or else gallium arsenide, for example. This is because the planar surface ensures that no voids are produced during the mating bonding and, consequently, the thermomechanical stresses of the component can advantageously be reduced.

In an advantageous embodiment of the component, the Bragg reflectors arranged in the interspaces may form the mirror covering free areas. In this case, it is possible to dispense with an additional mirror layer above the contact layer. On the other hand, it is then necessary, if appropriate, to cover the contact layer with a connecting layer which serves to make contact with the contact elements that are possibly electrically insulated from one another. For the case where the electrical contact layer has a reticular structure, when the mirror is formed by the Bragg reflectors, it is possible to dispense both with a mirror layer and with a connecting layer. This would be the case, for example, if an inverted structure with respect to the contact elements arranged in a hexagonal grid were provided for the electrical contact layer. In this case, the interspaces would then be arranged at the nodes of the regular hexagonal grid and the area round the outside would then be covered by the electrical contact layer.

Bragg reflectors usually comprise layer pairs stacked one above the other, the first layer of a layer pair having a high refractive index and the second layer of a layer pair having a low refractive index. When permitted by the layer thickness of the electrical contact layer, it is possible to stack 5 to 10 layer pairs one above the other in order to form the Bragg reflector. In this case, the Bragg reflector has a reflectivity which lies in the region of 99% or better and makes it possible to dispense with a further mirror layer or an additional mirror.

If the thickness of the patterned contact layer does not permit this, it is possible despite all that for a mirror layer also to be applied on the top side of the electrical contact layer in addition to the Bragg reflectors.

Since the thickness of a layer pair in a Bragg reflector is typically 100 nm, it would be necessary, in order to form a sufficiently good Bragg reflector, to form the contact layer and the Bragg reflectors with a thickness of approximately 1 (m. In order to produce a number of 5 or more layer pairs, it would be necessary to provide a layer thickness of approximately 500 nm. A reflectivity of the Bragg reflector of approximately 90% is obtained in this case, which already makes it possible to dispense with the provision of an additional mirror layer in many cases.

By virtue of the fact that a suitable number of layer pairs makes it possible to dispense with a mirror layer on the top side of the electrical contact layer, the connecting layer necessary, if appropriate, for contact connection on the top side of the contact layer can be made thinner than a corresponding mirror layer. A mirror layer on the top side of the contact layer would typically have a thickness of 100 nm. By contrast, a layer thickness of between 50 and 100 nm would be sufficient for a connecting layer.

BRIEF DESCRIPTION OF THE DRAWINGS

FIG. 1 shows, by way of example, a component in a diagrammatic cross section.

FIG. 2 shows, by way of example, a further component in a diagrammatic cross section.

FIG. 3 shows, by way of example, a further component in a diagrammatic cross section.

DETAILED DESCRIPTION OF THE DRAWINGS

Figure 4:
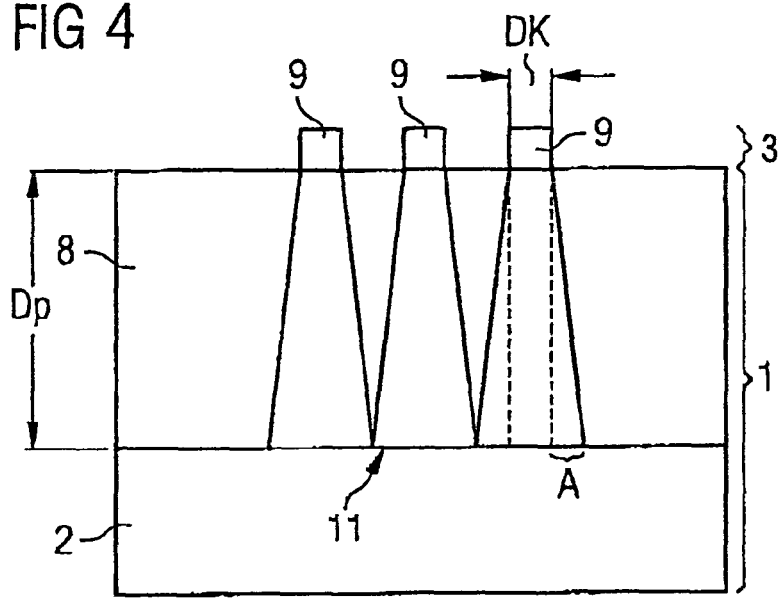
FIG. 4 shows a component in a diagrammatic cross section, in particular the current expansion being elucidated.

FIG. 1 shows a radiation-emitting semiconductor component, which may be a light-emitting diode, for example. In order to produce such a light-emitting diode, firstly an n-conducting, doped gallium nitride or aluminium gallium nitride epitaxial layer is grown on a growth substrate. An active zone 2 is then deposited on the said n-conducting doped layer, the said active zone containing one or more undoped layers, and forming a multiple quantum well (MQW) structure, for example. A p-doped layer 8 for the contact connection of the component is deposited onto the active zone 2. The p-doped layer 8 may, for example, contain gallium nitride or else aluminium gallium nitride in the form of an epitaxial layer. The semiconductor body 1 comprises the active zone 2 and also the p-doped layer 8. The deposition substrate and the n-doped layer are not illustrated in FIG. 1. A patterned contact layer 3 is deposited on the p-doped layer 8. In this case, the contact layer 3 comprises individual contact elements 9 which have the form of cylinders and accordingly appear rectangular in cross section. The contact elements 9 are electrically insulated from one another. The contact elements 9 are separated from one another. The contact elements 9 are spaced apart from one another, thus resulting in interspaces 4 between the contact elements 9. In a subsequent production step, a mirror layer 7 is deposited on the semiconductor body 1 and on the contact elements 9. In this case, the mirror layer 7 covers the semiconductor body 1, in particular the free areas 5 formed by the interspaces 4, which are even covered directly, and also the contact elements 9. The interspaces 4 form free areas 5 on the surface of the semiconductor body 1 which remain uncovered by the contact layer 3. FIG. 1 also illustrates the interface 11 between the p-doped layer 8 and the active zone 2 of the component.

The direct deposition of the mirror layer 7 over the patterned contact layer 3 results in a mirror layer 7 with a surface that is not smooth. Rather, projections are arranged at the locations of the mirror layer 7 which lie above contact elements 9. At the free areas 5, in particular, the mirror layer 7 forms a mirror which serves for the reflection of the radiation generated in the semiconductor body 1.

FIG. 2 shows another embodiment of the component, the electrical contact layer 3 having been planarized before the application of the mirror layer 7. This is done by providing a filler 12 in the interspaces 4 between the contact elements 9. Such a filler may be deposited for example after the application of the contact layer 3 subsequently on the semiconductor body 1. If appropriate, that part of the filler 12 which has overgrown the contact elements 9 must then also be removed. As soon as the contact elements 9 are uncovered again towards the top, the mirror layer 7 can be applied. In this case, the mirror layer 7 not only has the function of reflecting the radiation generated in the semiconductor body 1, rather it also has another task, namely of ensuring that electrical contact is made among the contact elements 9.

FIG. 3 shows a further embodiment of the component, the filler introduced in the interspaces 4 forming Bragg reflectors 13. Each Bragg reflector 13 comprises layer pairs 14 stacked one above the other. Each layer pair 14 has a first individual layer 141 having a high refractive index. Each layer pair 14 has a second individual layer 142 having a low refractive index. In the example according to FIG. 3, 7 layer pairs 14 are stacked one above the other in each Bragg reflector 13. As a result of the multiplicity of 7 layer pairs 14, the Bragg reflectors have a very good reflectivity lying between 90 and 99%. The Bragg reflectors 13 preferably form a mirror 6 covering the free areas 5 of the surface of the semiconductor body 1. This is possible by choosing the thickness d of the contact layer 3 to have a magnitude such that there is space for a sufficient number of layer pairs 14 on each free area 5. In this case, the thickness of the contact layer is approximately 700 nm. Since each layer pair 14 has a thickness of approximately 100 mu, there is space for 7 layer pairs 14 stacked one above the other. An increasing number of layer pairs 14 makes it possible to further improve the reflectivity of the Bragg reflectors 13, which further improves the selectivity and also the reflectivity of the component. On the basis of a number of approximately 5 to 6 layer pairs 14 lying one above the other, the reflectivity of the Bragg reflectors 13 becomes so good that it is possible to dispense with an additional mirror layer 7. It suffices, therefore, for a connecting layer 10 to be applied on the top side of the contact elements 9, which connecting layer, however, now only serves solely for the electrical contact connection of the contact elements.

The same materials as for the mirror layer 7 are taken into consideration for the material of the connecting layer 10. By way of example, silver or aluminum may be used. However, all other suitable materials which lead to contact being made among the contact elements 9 are also taken into consideration for the connecting layer 10.

FIG. 4 shows the formation of current cones in the p-doped layer 8. This is based on contact elements 9 arranged on the surface of the p-doped layer 8. The contact elements 9 have the form of a cylinder, the base area of the cylinder having a diameter DK of 6 μm. The current fed in at each contact element 9 does not remain concentrated in a channel which is bounded by the two broken lines in FIG. 4 and shows the perpendicular projection of the contact element 9 onto the interface 11 between the p-doped layer 8 and the active zone 2. Rather, the current channel is expanded by the transverse conductivity of the p-doped layer 8. In the case of an isotropic lateral conductivity, which is to be assumed here for simplification, the result is a conical expansion of the energized region of the p-doped layer 8. In this case, in the example considered here where the thickness Dp of the p-doped layer is 300 nm, the expansion A is approximately 1 to 1.5 μm. The intersection of the current cone that forms in this way with the interface 11 then yields that portion of the surface of the active zone 2 which is energized by the contact element 9. Ideally, the contact elements 9 are spaced apart from one another in such a way that the individual current cones touch one another on the interface 11. This is also possible, in principle, in a one-dimensional illustration in accordance with FIG. 4.

A somewhat different picture results upon transition to a realistic, two-dimensional illustration which conforms with the actual conditions in the semiconductor components considered here. It is possible here, in principle, either that the current cones touch one another along a single straight line, but then the entire interface is not energized (in this respect, also cf. FIGS. 5A and 5B). On the other hand, the entire interface 11 may be energized, but it is then necessary to provide an overlap between the current cones on the interface 11, which overlap leads to a denser coverage of the surface of the p-doped layer 8 with contact elements 9 and consequently results in poorer optical properties of the component.

Generally, the size or the diameter of the contact elements results from the possibilities of the photolithography. What would be most favourable theoretically would be to have the smallest possible contact elements 9 spaced apart from one another by the smallest possible distance. This would result in optimum homogeneous energization with maximum generation of light via the reflective areas. However, in the case of the materials that are suitable for the contact elements 9, the phototechnology exhibits limits which tend to have the result that structures <3 μm can only be realized with a very high outlay. This limit, then, specifies the minimum size of the contact elements.

The expansion A of the current cone lies between 1 and 1.5 μm in the case of the p-doped gallium nitride layer considered in FIG. 4. However, the expansion A is dependent on the doping and the crystal quality, which is why here it is only possible to specify the limits of an interval for the expansion A.

Moreover, there is also another reason in favour of the contact elements 9 having a certain minimum size. This is because if contact elements are too small, the contact area between the contact element 9 and the p-doped layer 8 decreases to such a great extent that relatively high contact resistances occur, which would reduce the efficiency of the component.

Figure 5A:
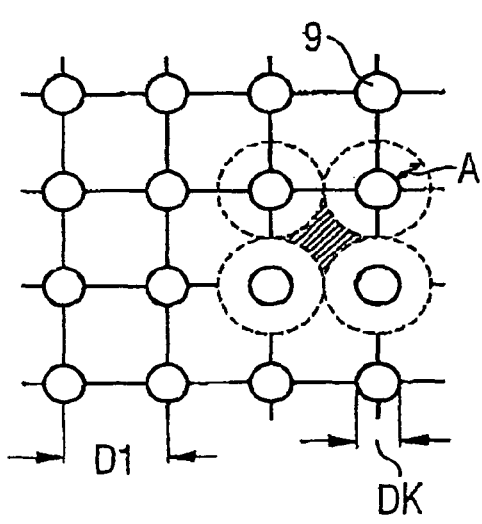
FIG. 5A shows the arrangement of contact elements at the nodes of a square grid.

FIG. 5A then shows the arrangement of contact elements 9 at the nodes of a square grid in one plane. The distances between the contact elements 9 correspond to the grid dimension D1, which defines the dimension of the square grid. The grid dimension D1 is set such that it corresponds to the sum of the diameter DK of the contact element 9 together with the expansion A of a current cone. Accordingly, in accordance with FIG. 5A, the current cones, the intersection of which with the interface 11 is indicated by dotted circles, lie next to one another in such a way that they just touch one another in each case along a straight line. However, this arrangement of the contact elements 9 has the effect that a relatively large unenergized partial area of the interface 11 results in the centre of each square. Therefore, although the arrangement of the contact elements 9 in accordance with FIG. 5A is one possible embodiment for the semiconductor component, it is not yet the optimum arrangement of the contact elements 9.

The non-energized partial area of the interface 11 is identified by way of example by hatching.

Figure 5B:
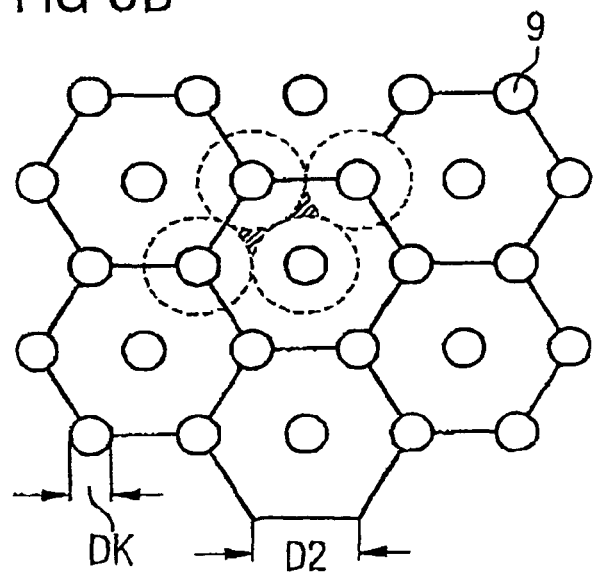
FIG. 5B shows the arrangement of contact elements at the nodes of a hexagonal grid.

FIG. 5B shows an improved arrangement of the contact elements 9. In accordance with FIG. 5B, contact elements 9 lie at the nodes of a regular hexagonal grid. Such a grid is formed by regular hexagons, each regular hexagon being surrounded by six further regular hexagons and the regular hexagon which lies in the centre having a common side edge with each of the surrounding regular hexagons. In addition, a contact element 9 lies in the centre of each regular hexagon.

In FIG. 5A, the diameter of the contact elements is 8 μm. Together with an expansion A of 1.5 μm, a grid dimension D2 of 11 μm results.

FIG. 5B shows an arrangement of contact elements 9 in which the diameter DK of the contact elements 9 is 6 μm. In a manner corresponding to that in FIG. 5A, in FIG. 5B as well, the distances between the contact elements 9 lying at nodes of the hexagonal grid are chosen in such a way that the intersection areas of the current cones on the interface 11 just touch one another along a straight line. With a contact element diameter DK of 6 μm and a current expansion of 1.5 μm, this results in a grid dimension D2 of 9 μm.

Although the arrangement of the contact elements 9 in accordance with FIGS. 5A and 5B achieves the same degree of coverage of 40%, it can be seen from FIG. 5B that the non-energized proportion of the interface 11 is significantly smaller. Parts of the non-energized proportion of the interface 11 are again identified by the hatched areas.

A mathematical analysis of the arrangements of contact elements 9, which are only sketched in roughly diagrammatic fashion here, arrives at the result that, in comparison with the example in accordance with FIG. 5A, the non-energized proportion of the interface 11 is reduced approximately by the factor 5 in the case of an arrangement in accordance with FIG. 5B.

This application claims the priority of the German Patent application DE 102 449 86.4, dated Sep. 26, 2002 which is herewith incorporated by reference in the present description.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

We claim:

1. A radiation-emitting semiconductor component comprising:
   a semiconductor body comprising an active zone;
   a patterned contact layer applied on a surface of the semiconductor body for electrical contact connection, wherein the patterned contact layer has a thickness which is less than 100 nm;
   interspaces distributed over the patterned contact layer for the purpose of forming free areas on the surface which are not covered by the patterned contact layer; and a mirror for covering the free areas.

2. The component according to claim 1, in which the mirror is embodied as a closed mirror layer covering the free areas and the patterned contact layer.

3. The component according to claim 2, in which the material of the patterned contact layer links electrically better to the semiconductor body than the material of the mirror layer.

4. The component according to claim 2, in which the material of the mirror layer reflects the radiation generated in the active zone better than the material of the patterned contact layer.

5. The component according to claim 1, in which the surface of the semiconductor body is formed by a p-doped layer made of a nitride compound semiconductor, and in which the material of the patterned contact layer forms an ohmic contact with respect to the surface.

6. The component according to claim 1, in which the patterned contact layer contains platinum or nickel.

7. The component according to claim 2, in which the mirror layer contains silver or aluminum.

8. The component according to claim 1, in which the patterned contact layer comprises contact elements that are separated from one another, and in which a connecting layer for making contact among the contact elements is provided on the patterned contact layer.

9. The component according to claim 8, in which the contact elements have the form of cylinders.

10. The component according to claim 8, in which the contact elements are arranged at the nodes of a regular grid.

11. The component according to claim 10, in which the regular grid is a square grid.

12. The component according to claim 8, in which the surface of the semiconductor body is formed by a p-doped layer made of a nitride compound semiconductor, the p-doped layer having a surface which faces the active zone and constitutes an interface, wherein the distance between every two adjacent contact elements is related to the transverse conductivity of the p-doped layer such that the entire interface can be energized.

13. The component according to claim 10, in which the regular grid is a hexagonal grid.

14. The component according to claim 1, in which the interspaces are filled with a filler in order to at least partially planarize the surface of the patterned contact layer.

15. The component according to claim 14, in which the filler contains an electrically conductive material.

16. The component according to claim 14, in which the filler contains a transparent and electrically insulating material.

17. The component according to claim 15, in which the filler contains zinc oxide or indium tin oxide.

18. The component according to claim 16, in which the filler contains $SiO_2$, a compound made of silicon and nitrogen or titanium oxide or plastic.

19. The component according to claim 14, in which the filler forms Bragg reflectors.

20. The component according to claim 19, in which the Bragg reflectors are produced from dielectrics.

21. The component according to claim 19, in which the Bragg reflectors are produced by epitaxy.

22. The component according to claim 1, in which the mirror is formed by Bragg reflectors arranged in the interspaces of the contact layer.

23. The component according to claim 22, in which the Bragg reflectors contain layer pairs lying one on top of the other, of which respectively one has a high refractive index and one has a low refractive index, and in which a number greater than 5 of layer pairs are provided in each Bragg reflector.

24. A radiation-emitting semiconductor component comprising:
a semiconductor body comprising an active zone;
a patterned contact layer applied on a surface of the semiconductor body for electrical contact connection, wherein the patterned contact layer comprises contact elements that are separated from one another, and wherein the contact elements have the form of cylinders;
interspaces distributed over the patterned contact layer for the purpose of forming free areas on the surface which are not covered by the patterned contact layer; and
a mirror for covering the free areas.

25. A radiation-emitting semiconductor component comprising:
a semiconductor body comprising an active zone;
a patterned contact layer applied on a surface of the semiconductor body for electrical contact connection;
interspaces distributed over the patterned contact layer for the purpose of forming free areas on the surface which are not covered by the patterned contact layer, wherein the interspaces are filled with a filler in order to at least partially planarize the surface of the patterned contact layer, and wherein the filler contains a transparent and electrically insulating material; and
a mirror for covering the free areas.

* * * * *